(12) United States Patent
Berringer

(10) Patent No.: US 9,945,690 B2
(45) Date of Patent: Apr. 17, 2018

(54) METERING CIRCUIT INCLUDING A TIME-VARYING REFERENCE AND METHOD

(71) Applicant: Silicon Laboratories Inc., Austin, TX (US)

(72) Inventor: Kenneth A Berringer, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/135,552

(22) Filed: Dec. 19, 2013

(65) Prior Publication Data

US 2015/0177280 A1 Jun. 25, 2015

(51) Int. Cl.
| | |
|---|---|
| *G01R 17/00* | (2006.01) |
| *G01D 5/12* | (2006.01) |
| *H03K 5/1532* | (2006.01) |
| *G01F 25/00* | (2006.01) |
| *G01F 15/02* | (2006.01) |

(52) U.S. Cl.
CPC ............ *G01D 5/12* (2013.01); *G01F 15/022* (2013.01); *G01F 25/0007* (2013.01); *H03K 5/1532* (2013.01)

(58) Field of Classification Search
CPC .... G01R 17/00; G01R 17/02; G01R 27/2623; G01R 19/252; G01R 23/00; H03K 2217/94026; G01P 15/16; G01P 3/48; G06M 1/108; H03L 7/099; G04F 13/00

USPC ......................................................... 324/679
See application file for complete search history.

(56) References Cited

U.S. PATENT DOCUMENTS

| | | | |
|---|---|---|---|
| 4,045,728 A | 8/1977 | Fletcher et al. | |
| 5,504,401 A * | 4/1996 | Archibald | H05B 41/282 315/224 |
| 6,091,239 A * | 7/2000 | Vig et al. | 324/207.2 |
| 6,549,120 B1 | 4/2003 | de Buda | |
| 7,723,979 B2 | 5/2010 | Ashburn | |
| 2003/0042885 A1* | 3/2003 | Zhou | G01R 21/14 324/105 |
| 2008/0297256 A1* | 12/2008 | Eken | G01R 21/01 330/278 |
| 2009/0189778 A1 | 7/2009 | Juan et al. | |
| 2010/0302061 A1 | 12/2010 | Winter et al. | |
| 2011/0291678 A1* | 12/2011 | Pflum et al. | 324/705 |
| 2013/0002242 A1* | 1/2013 | Tsukamoto et al. | 324/207.12 |
| 2013/0167652 A1* | 7/2013 | Pflum et al. | 73/861 |
| 2013/0169265 A1* | 7/2013 | Tamura et al. | 324/76.77 |

* cited by examiner

*Primary Examiner* — Son Le
*Assistant Examiner* — Akm Zakaria
(74) *Attorney, Agent, or Firm* — Cesari & Reed LLP; R. Michael Reed

(57) ABSTRACT

A metering circuit includes a comparator including a first input to receive an input signal, and including a second input and an output. The metering circuit further includes a reference source to provide a time-varying reference signal to the second input during a peak counting operation.

20 Claims, 10 Drawing Sheets

METERING CIRCUIT INCLUDING A TIME-VARYING REFERENCE AND METHOD

FIELD

The present disclosure is generally related to metering circuits, such as circuits configured to count signal peaks from a ringing signal to determine usage of a utility, for example.

BACKGROUND

Water and gas meters use a variety of measuring and sensing techniques. One method of sensing position and rotation of a metering apparatus uses inductor-capacitor (LC) sensing, which employs an LC resonant circuit. An LC meter interface may stimulate the LC resonant circuit and measure the response (a ringing waveform).

SUMMARY

In an embodiment, a metering circuit includes a comparator including a first input to receive an input signal, and including a second input and an output. The metering circuit further includes a reference source to provide a time-varying reference signal to the second input during a peak counting operation.

In another embodiment, a metering circuit includes a first comparator having a first input to receive a resonant signal, a second input to receive a time-varying reference signal, and an output. The metering circuit further includes a counter to count pulses at the output of the first comparator and a second comparator to determine a state of a system based on a count at an output of the counter.

In still another embodiment, a method includes receiving a resonant signal at a first input of a comparator and receiving a time-varying reference signal at a second input of a comparator. The method further includes counting a number of peaks of the resonant signal that exceed the time-varying reference signal and determining a state of a system based on the count.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of metering circuits, programmable reference circuits, and methods are described below that use a variable reference signal as a reference input to a comparator having an input to receive an input signal (ringing waveform) to detect peaks in the input signal. In an embodiment, a controller, such as a finite state machine, may control a programmable reference to provide a linearly decreasing reference or an exponentially decreasing reference. In an embodiment, the controller may provide a DC reference to the input of the comparator for a first period of time and may subsequently select a suitable reference waveform (linearly decreasing or exponentially decreasing) based on captured samples. In another embodiment, the controller may determine a damping characteristic of the input signal and may configure a reference signal that is exponentially decreasing based on the damping characteristic of the input signal.

By varying the reference signal, the circuit may increase a distance between a number of oscillations of an undamped signal as compared to the number of oscillations in a damped signal. The time-varying reference signal may assist the circuit to discriminate between system states (damped versus undamped) as compared to the same circuit using a DC reference. One possible example of a system including a metering apparatus having a programmable reference is described below with respect to FIG. 1.

Figure 1:
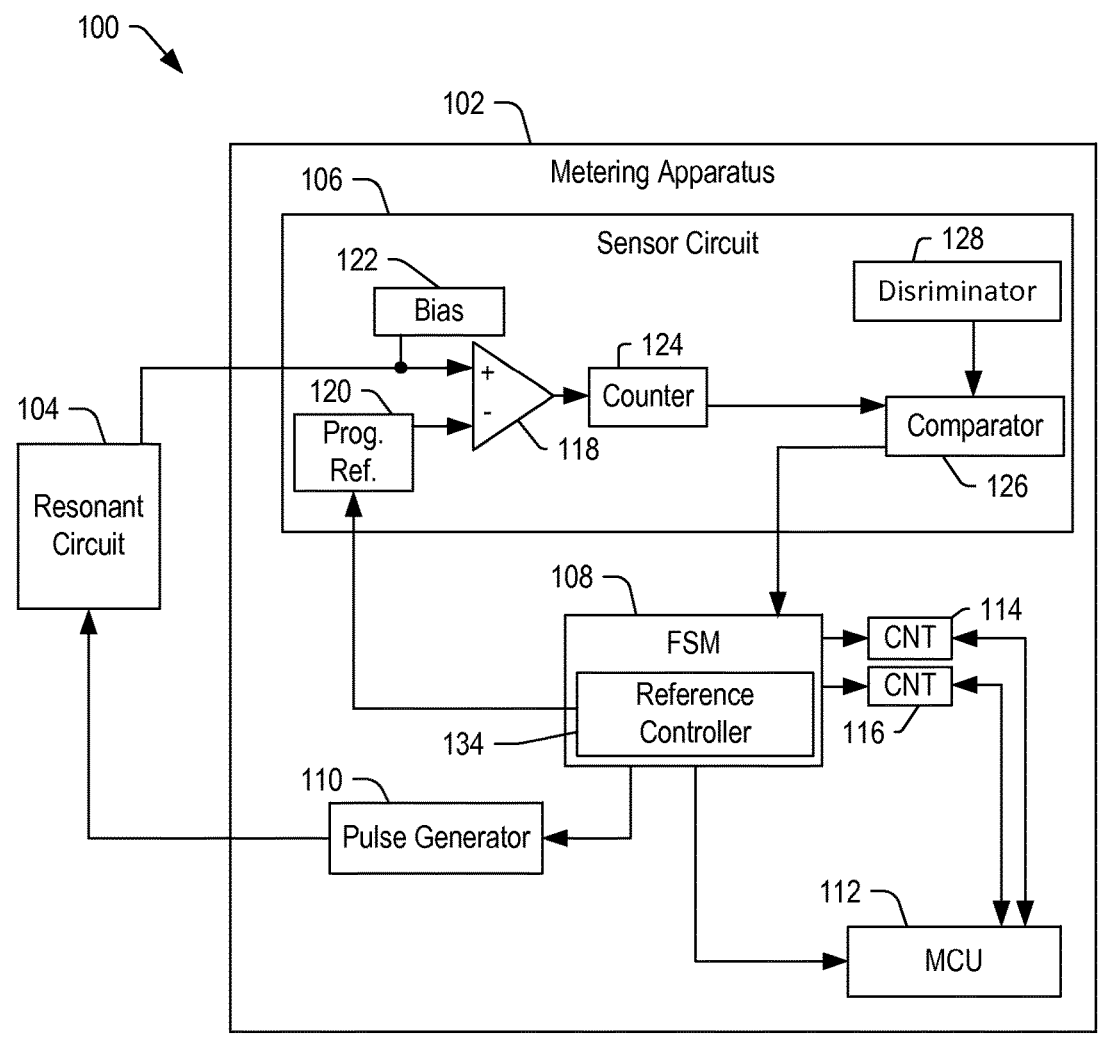
FIG. 1 is a block diagram of a system including a metering apparatus having a programmable reference to provide a time-varying reference according to an embodiment.

FIG. 1 is a block diagram of a system including a metering apparatus having a programmable reference to provide a time-varying reference according to an embodiment. In the illustrated example, metering system 100 includes metering apparatus 102 coupled to a resonant circuit 104. In another embodiment, resonant circuit 104 may be replaced with a capacitive sense circuit, a Wheatstone bridge circuit, or other circuitry adapted to produce a measurable signal in response to a parameter to be measured. In an embodiment, resonant circuit 104 may be an inductor-capacitor (LC) tank circuit configured to produce a resonant signal that varies based on a rotational position of a wheel. In an example, the resonant signal may have a first signal characteristic when a non-metallized portion of the wheel is proximate to the LC tank circuit and may have a second (damped) signal characteristic when a metallized portion of the wheel is proximate to the LC tank circuit.

The metering apparatus 102 may include a pulse generator 110 and a sensor circuit 106, which are coupled to a controller, which is implemented as a finite state machine (FSM) 108 in the illustrated example. In an alternative embodiment, the controller may be implemented as processor readable instructions executing on a processor or may be implemented by the MCU 112. In another embodiment, the controller may be implemented as a dedicated hardware implementation including, but not limited to, application specific integrated circuits, programmable logic arrays, and other circuit devices. The FSM 108 may also be coupled to an MCU 112 and to count registers 114 and 116.

The sensor circuit 106 includes a comparator 118 having a first input coupled to the resonant circuit 104 to receive an input signal, which may be a ringing waveform. The first input may also be coupled to a bias source 122 adapted to level shift the input signal. In an embodiment, the bias source 122 may level shift the input signal to a level that is approximately half of rail-to-rail voltage. The comparator 118 further includes a second input coupled to a programmable reference 120 to receive a time-varying reference signal during a peak counting operation (i.e., to detect peaks of the ringing waveform), and includes an output coupled to a counter 124. The counter 124 includes an output coupled to a first input of a comparator 126, which has a second input coupled to a discriminator 128 and an output coupled to the FSM 108. The comparator 126 is adapted to receive a count from the counter 124 and a discriminator threshold from the discriminator 128 and to produce an output signal corresponding to a result of the comparison.

The FSM 108 includes a reference controller 134 that is configured to provide a control signal to the programmable reference 120 to control the programmable reference to provide a selected time-varying signal, such as a linearly decreasing reference signal or an exponentially decreasing reference signal. The selection and control the programmable reference are described in detail below with respect to FIGS. 5-8.

In an embodiment, the FSM 108 may cause the pulse generator 110 to provide an excitation signal to the resonant circuit 104. The sensor circuit 106 may receive an input signal (a ringing waveform) in response to the excitation signal. The comparator 118 may compare the input signal to a reference signal from the reference source 120 and may produce an output signal that has a logic high level when the input signal exceeds the reference signal and a logic low level when the input signal falls below the reference signal. The output signal is provided to the counter 124 which counts the pulses and provides a count of the pulses to the comparator 126. The comparator 126 compares the count to a discriminator threshold from the discriminator 128 and produces an output signal representing the state of the system 100. In an embodiment, the output signal of the comparator 126 has a first value when the count indicates an undamped state of the system 100, and has a second value when the count indicates a damped state of the system 100.

In an embodiment, the resonant circuit 104 may be an LC resonant tank. Alternatively, other types of circuits may be used, including a capacitive sense circuit, a Wheatstone bridge circuit, or other circuitry adapted to produce a measurable signal in response to a parameter to be measured. Further, while the illustrated example of FIG. 1 depicts a single resonant circuit 104, in some embodiments, a second resonant circuit may be coupled to a second sensing circuit within the metering apparatus 102. In an embodiment of the metering apparatus 102 that is configured to monitor rotation of a wheel, sensing circuits (such as first and second resonant circuits) may be positioned adjacent to the wheel and spaced apart from one another to provide dual measurement signals, which can be processed to determine the rate of rotation as well as the direction using a quadrature technique. In this example, as a metallized portion of the wheel is proximate to one of the resonant circuits, the input signal to the sensing circuit 106 may be dampened. In contrast, when a non-metallized portion of the wheel is proximate to one of the resonant circuits, the input signal to the sensing circuit 106 may be undamped. One possible example of a metering system including a metering circuit that can receive two different resonant signals is described below with respect to FIG. 2.

Figure 2:
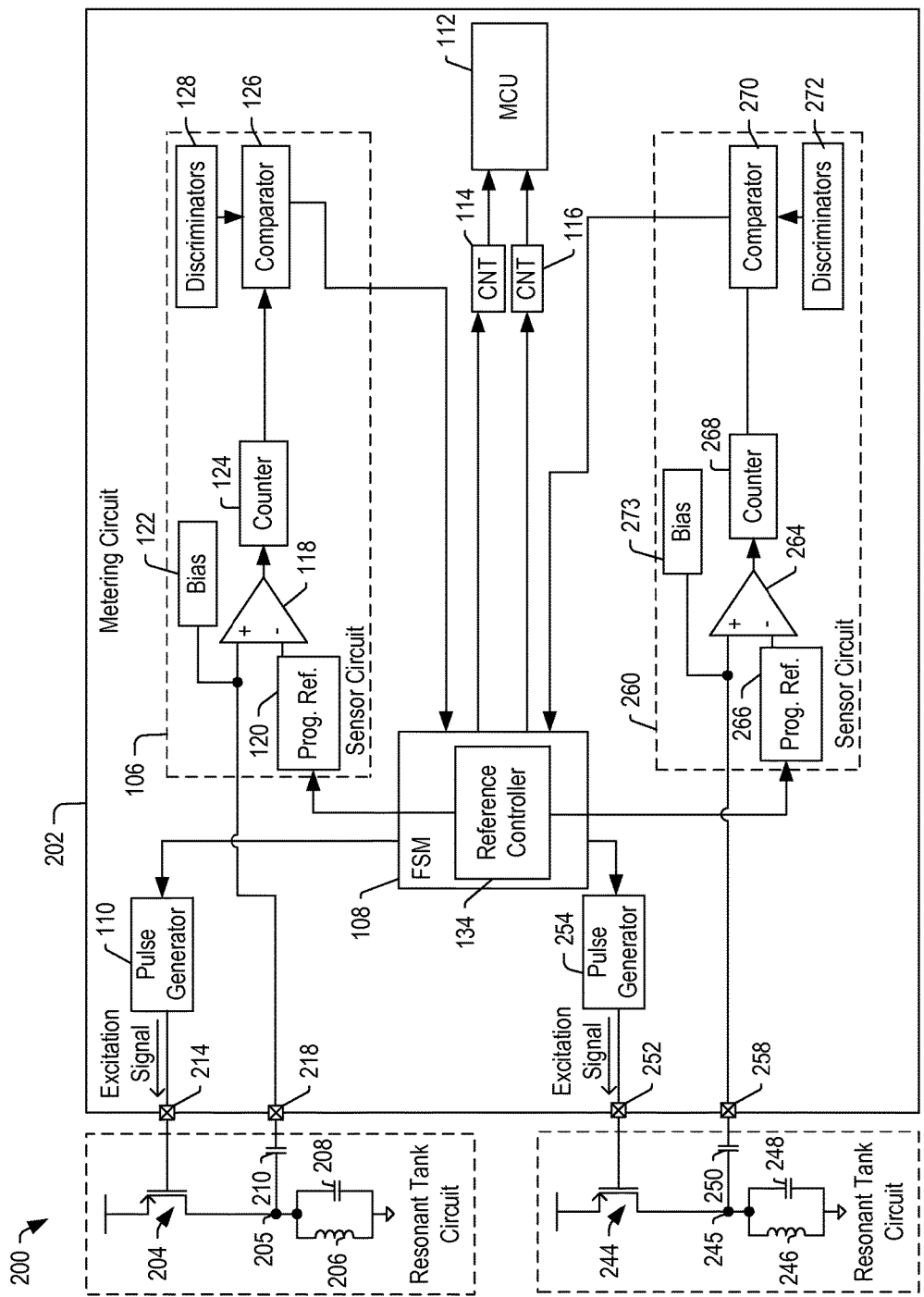
FIG. 2 is a block diagram of a system including a metering apparatus having a programmable reference to provide a time-varying reference according to a second embodiment.

FIG. 2 is a block diagram of a system 200 including a metering circuit 202 having a programmable reference 120 (and a programmable reference 266) to provide a time-varying reference according to a second embodiment. Metering circuit 202 is configured to receive a signal from two external circuits, which in this embodiment include resonant tank circuits. In the illustrated example, metering circuit 202 includes all of the elements of metering apparatus 102 of FIG. 1, including sensor circuit 106, FSM 108, pulse generator 110, MCU 112, and count registers 114 and 116. Further, the metering circuit 202 includes additional circuitry to facilitate operation with two input signal sources, such as resonant tank circuits.

The metering circuit 202 includes the pulse generator 110 coupled between the FSM 108 and an output 214, which may be implemented as a pad, pin or contact location configurable to interconnect with an external circuit. The metering circuit 202 further includes an input 218, which may be implemented as a pad, pin, or contact location configurable to interconnect with an external circuit. The input 218 may be coupled to the sensor circuit 106.

The sensor circuit 106 includes the comparator 118 having a first input coupled to input 218 and to the bias source 122, a second input coupled to the programmable reference 120, and an output coupled to the counter 124. The counter 124 includes an output coupled to a first input of the comparator 126, which includes a second input coupled to the discriminator 128 and includes an output.

The metering circuit 202 further includes a pulse generator 254 coupled between the FSM 108 and an output 252, which may be implemented as a pad, pin or contact location configurable to interconnect with an external circuit. The metering circuit 202 further includes an input 258, which may be implemented as a pad, pin, or contact location configurable to interconnect with an external circuit. The input 218 is coupled to a sensor circuit 260.

The sensor circuit 260 includes a comparator 264 having a first input coupled to the input 258 and to a bias source 273, a second input coupled to a programmable reference 266, and an output coupled to a counter 268. In an example, the bias source 273 may include a voltage configured to level shift the input signal. In an alternative embodiment, programmable reference 120 and programmable reference 266 may be the same. The counter 268 includes an output coupled to a first input of a comparator 270, which includes a second input coupled to a discriminator 272. The comparator 270 further includes an output.

The metering circuit 202 includes the FSM 108, which includes outputs coupled to pulse generators 110 and 254. Further, the FSM 108 includes an input coupled to the output of comparator 126 and an input coupled to the output of comparator 270. The FSM 108 also includes an output coupled to count register 114 and an output coupled to count register 116. The metering circuit 202 further includes a microcontroller unit (MCU) 112 coupled to count registers 114 and 116. MCU 112 may include a plurality of connections (not shown) to communicate with other circuitry of metering circuit 202 (such as transceivers, memory, and other circuits).

The external resonant tank circuits may be configured to generate a resonant signal that has damping characteristics that vary based on a parameter to be sensed. In the illustrated example, the resonant circuits are LC tank circuits including a first resonant tank circuit that includes a transistor 204 coupled between a power supply and a node 205, and including a gate coupled to output 214 of metering circuit 202. The first resonant tank circuit further includes an inductor 206 and a capacitor 208 coupled in parallel between node 205 and a second power supply, such as ground. Additionally, the first resonant tank circuit is AC coupled to input 218 through capacitor 210, which is coupled between node 205 and input 218.

The resonant tank circuits further include a second resonant tank circuit having a transistor 244 coupled between a power supply and a node 245, and including a gate coupled to output 252 of metering circuit 202. The second resonant tank circuit further includes an inductor 246 and a capacitor 248 coupled in parallel between node 245 and a second power supply, such as ground. Additionally, the second resonant tank circuit is AC coupled to input 258 through capacitor 250, which is coupled between node 245 and input 258. While the transistors 204 and 244 are depicted as being external to metering circuit 202, in some embodiments, transistors 204 and 244 may be integrated into metering circuit 202.

In an embodiment, the FSM 108 sends a signal to pulse generator 110, causing pulse generator 110 to apply an excitation signal or pulse to output 214. The excitation signal biases transistor 204 to briefly couple the power supply to node 205, charging capacitor 208. When the excitation signal is stopped (i.e., the pulse ends), transistor 204 decouples the power supply from node 205. Charge stored by capacitor 208 is discharged into inductor 206, building up a magnetic field around the inductor 206 and reducing the voltage stored by the capacitor 208. When the capacitor 208 is discharged, the inductor 206 will have the charge stored in its magnetic field and since the inductor 206 resists changes in current flow, the energy to keep the current flowing is extracted from the magnetic field, which begins to decline, and the current flow will charge the capacitor 208 with a voltage of opposite polarity to its original charge. When the magnetic field of inductor 206 is dissipated, the current stops and the opposite polarity charge is stored in capacitor 208. The discharge/recharge process is repeated with the current flowing in the opposite direction through the inductor 206. The energy oscillates back and forth between the capacitor 208 and the inductor 206 until (if not replenished by power from an external circuit, such as the power supply through transistor 204) internal resistance makes the oscillations die out. When used in conjunction with a metering wheel that has a metallized portion, the oscillations die out faster (damped) when the metallized portion is proximate to the resonant tank circuit and die out slower (undamped) when the non-metallized portion is proximate to the resonant tank circuit.

The comparators 118 and 264 compare the input signals from inputs 218 and 258 to reference signals from programmable references 120 and 266, respectively, to detect peaks within the input signals and to provide an output signal corresponding to the peaks to counters 124 and 268, respectively. The comparator 126 produces an output indicating a state (damped or undamped) of the system 200 as determined from the count provided by counter 124. Similarly, the comparator 270 produces an output signal indicating a state (damped or undamped) of the system 200 as determined from the count provided by counter 268.

In an embodiment, the FSM 108 uses the reference controller 134 to control programmable reference 120 to provide a time-varying reference signal to comparator 118. Further, the FSM 108 uses the reference controller to control programmable reference 266 to provide a time-varying reference signal to comparator 264. In an embodiment, the time-varying reference signals may be different from one another, accounting for variations in the circuitry (including the external tank circuits).

In an example, the programmable reference 120 provides a first reference signal to the comparator 118, and the programmable reference 266 provides a second reference signal to the comparator 264. In an embodiment, the first reference signal and the second reference signal are both linearly decreasing signals. In an embodiment, the first and second reference signals are linearly decreasing signals that have the same or different slopes and that have the same or different amplitudes. In another embodiment, the first reference signal and the second reference signal are both exponentially decreasing signals having the same or different rates of decay and having the same or different initial amplitudes.

It should be understood that the FSM 108 or the FSM 108 in conjunction with the MCU 112 may select a suitable waveform for the reference signal and may selectively adjust the levels to enhance the detectable differences between the damped signal and the undamped signal. To appreciate the configuration of the reference signal waveform, it is useful to have an understanding of the operation of a resonant circuit, such as the tank circuits of FIG. 2. In the following discussion, the circuit operation is discussed with respect to the resonant tank circuit that includes inductor 206 and capacitor 208; however, the discussion is equally applicable to the resonant tank circuit that includes inductor 246 and capacitor 248.

The basic equations for a resonant tank circuit implemented as an LC tank are discussed below. The resonant frequency (f) of the circuit may be determined from the following equation:

$$f = \frac{1}{2\pi\sqrt{L_{206}C_{208}}}, \tag{1}$$

where the variable (L) refers to the inductance and the variable (C) refers to the capacitance. The determination of the resonant frequency of the LC circuit including the parasitic resistance of the inductor adds an extra term as shown in the following equation:

$$f = \frac{1}{2\pi}\sqrt{\frac{1}{L_{206}C_{208}} - \left(\frac{R_{206}}{L_{206}}\right)^2}, \tag{2}$$

where the variable (R) represents the parasitic resistance. Observation of the circuit indicates that the frequency changes very little due to the parasitic resistance because the parasitic resistance is very small for high-Q inductors, and because the second term is therefore small.

The energy (E) initially stored in the capacitor 208 in response to the excitation signal from pulse generator 110 may be determined according to the following equation:

$$E = \frac{1}{2}C_{208}V^2, \tag{3}$$

where the variable (V) represents the voltage level of the power supply coupled to the capacitor 208 through transistor 204. The energy that is initially stored in the capacitor 208 is transferred to the inductor 206 according to the following equation:

$$E = \frac{1}{2} L_{206} I^2, \tag{4}$$

where the variable (I) represents the current flowing into the inductor 206 as the capacitor 208 discharges. The voltage and current oscillate until the energy is dissipated through the parasitic resistance.

The waveform generated by this oscillation may be determined according to the following equation:

$$v(t) = V_i e^{-\alpha t} \cos(\omega t + \varphi), \tag{5}$$

where the variable ($V_i$) represents an initial voltage, the variable (w) represents the angular velocity, the variable ($\varphi$) represents a phase, the variable (t) represents time, and the variable ($\alpha$) represents the damping attenuation. The signal envelope may be determined according to the following equation:

$$v(t) = V_i e^{-\alpha t}, \tag{6}$$

which equation defines the amplitude of the oscillating signal. The damping attenuation may be determined according to the following equation:

$$\alpha = \frac{R}{2L}. \tag{7}$$

Based on observations, the damping attenuation varies when a metal object is in close proximity to the inductor 206, adding a loss term that increases the resistance and damping the input signal. The damped versus undamped attenuation varies from about five percent to twenty percent, depending on the quality of the inductor and the amount of losses inserted. In an example, the temperature coefficient of copper is approximately 0.68% per degree Celsius (° C.). Assuming a copper wire inductor, the resistance may increase by about forty percent at plus 85° C. and may decrease by about 44% at minus 40° C. The variation in resistance over temperature may be greater than the change in the damping attenuation.

Figure 3:
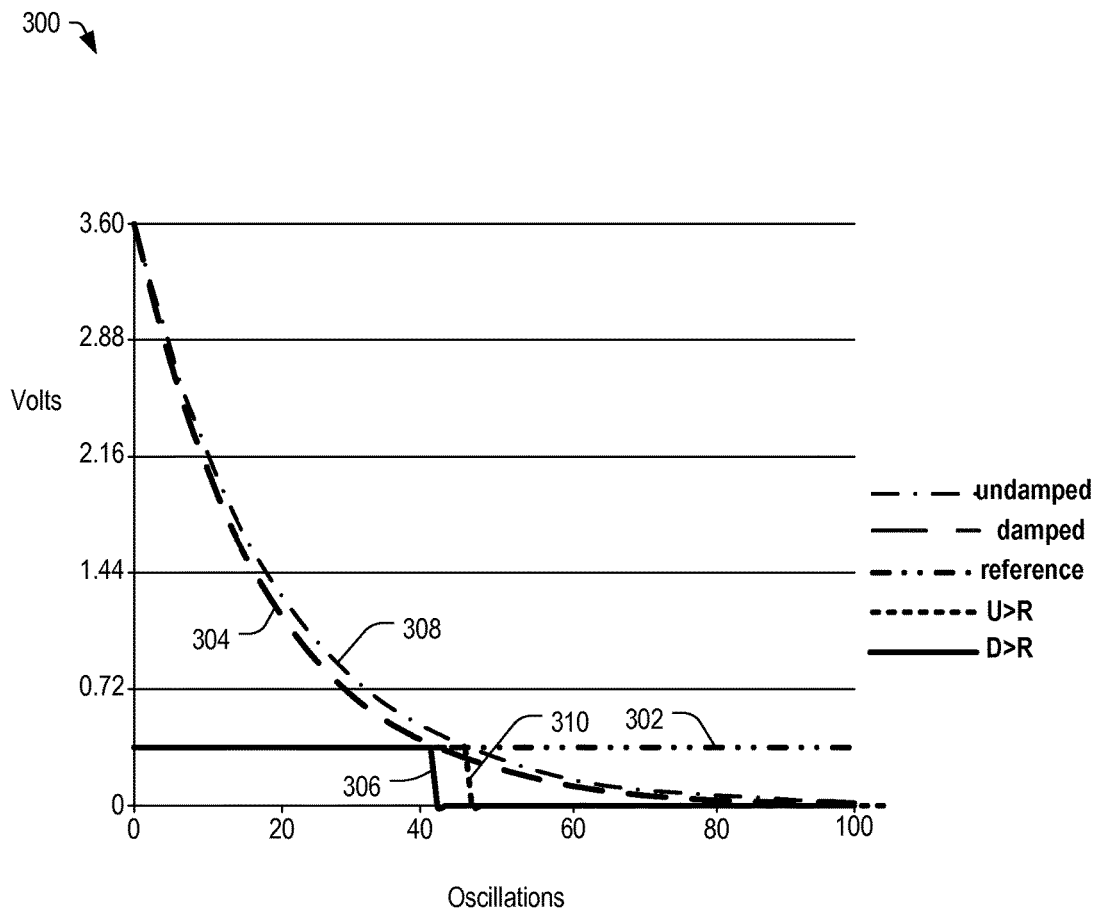
FIG. 3 is a diagram of voltage versus oscillations depicting a difference between a damped input signal and an undamped input signal using a DC reference.

Now referring to FIG. 3, a diagram 300 is presented that depicts a fixed (DC) reference voltage 302 that is applied over the full temperature range. The diagram includes a line representing a damped envelope 304 of the input signal that decreases from about 3.6 volts and approaches zero volts asymptotically at about ninety to one hundred counts, and a second line representing an undamped envelope 308 of the input signal, which follows a very similar exponentially decreasing curve, that approaches zero volts asymptotically at about 83 to 93 counts. The damping of the damped input signal is attributable to the resistance from proximity of a metallized portion of a wheel, for example. The damped envelope 304 and the undamped envelope 308 represent decreasing peak amplitudes of the ringing waveform over time.

Reference signal 302 intersects the damped envelope 304 at a location 306, which corresponds to about 42 oscillations, while the reference signal intersects the undamped envelope 308 at a location 310 that corresponds to approximately 47 oscillations, providing a separation between the number of oscillations of the damped envelope 304 relative to the undamped envelope 308 of approximately five counts.

The circuit 102 and 202 in FIGS. 1 and 2 provide an integer number of counts based on how many oscillations fit into a period corresponding to a difference between when the undamped envelope 308 crosses the DC reference 302 as compared to when the damped envelope 308 crosses the DC reference 302. A fixed DC reference 302 can provide a direct measurement of the damping attenuation, if the parameters are configured just right. The delta in the measurements will be greatest when the DC reference 302 is set as low as possible.

The equation for the envelope of the exponential decay can be solved for the time delta according to the following equations:

$$V_i e^{-\alpha_u t_u} = V_{REF}, \tag{8}$$

where the variable ($t_u$) represents for the undamped time, and the variable ($\alpha_u$) represents the damping attenuation in the undamped state. The undamped time can be calculated according to the following equation:

$$t_u = \frac{\ln\left(\frac{V_i}{V_{REF}}\right)}{\alpha_u}. \tag{9}$$

The time delta between the undamped time and damped time may be calculated as follows:

$$t_u - t_d = \ln\left(\frac{V_i}{V_{REF}}\right)\left(\frac{1}{\alpha_u} - \frac{1}{\alpha_d}\right), \tag{10}$$

where the variable ($t_d$) is the damped time, and the variable ($\alpha_d$) represents the damping attenuation in the damped state.

The number of counts can be calculated from equations 8, 9 and 10. Using a small reference voltage may provide more counts. The count (n) can be determined as follows:

$$n = \frac{\ln\left(\frac{V_i}{V_{REF}}\right)\left(\frac{1}{\alpha_u} - \frac{1}{\alpha_d}\right)}{2\pi\sqrt{L_{206}C_{208}}}. \tag{11}$$

In an embodiment, the value of the count number (n) can be determined over several counts. Further, inserting the equation for the attenuating damping factor results in the following equation:

$$n = \frac{\ln\left(\frac{V_i}{V_{REF}}\right)\left(\frac{2L_{206}}{R_{206}} - \frac{2L}{R_d}\right)}{2\pi\sqrt{L_{206}C_{208}}}, \tag{12}$$

where the variable ($R_d$) represents the effective virtual inductor resistance due to metal in proximity to the inductor 206.

Unfortunately, a DC reference 302 that remains constant across temperature variations may experience temperature induced errors that alter the difference between the number of detected oscillations, making it more difficult to differentiate between a damped condition and an undamped condition in certain circumstances. However, by providing a time-varying reference, the difference between the counts in a damped state versus and undamped state can be increased. One possible example that provides a linearly decreasing reference is described below with respect to FIG. 4.

Figure 4:
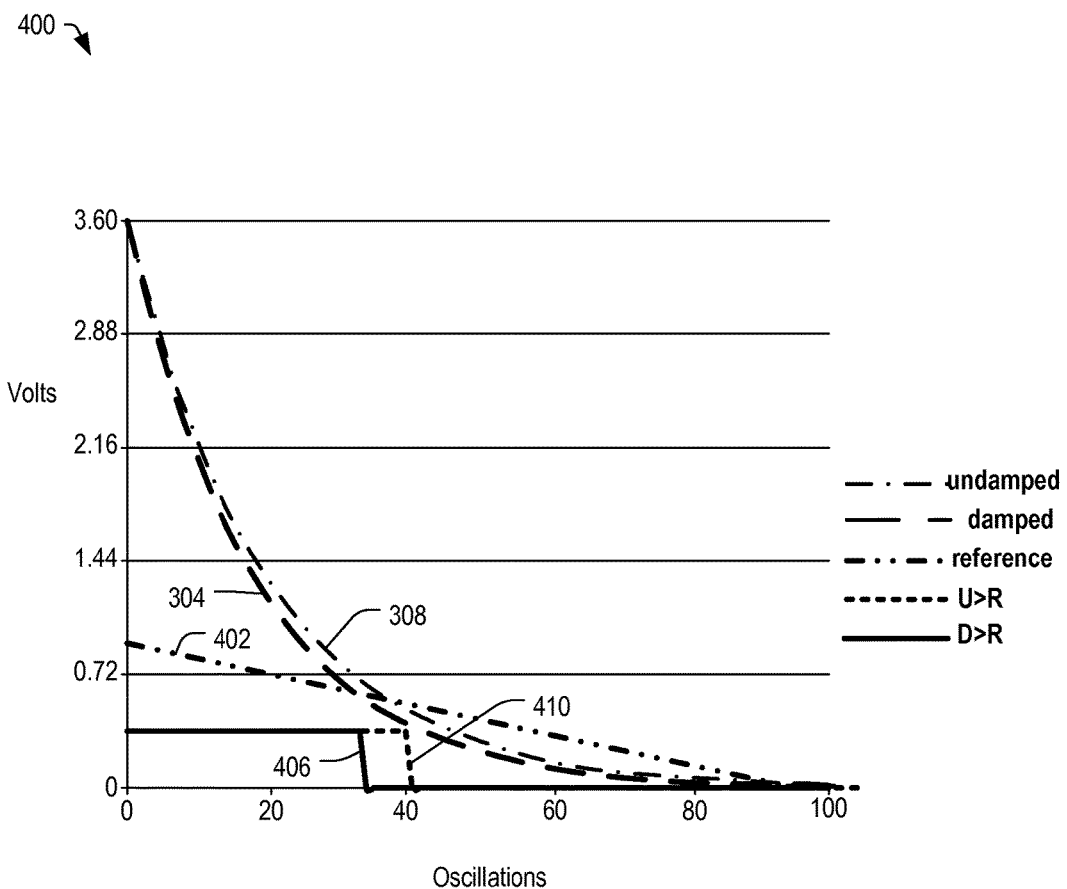
FIG. 4 is a diagram of voltage versus oscillations depicting a difference between a damped input signal and an undamped input signal using a linearly decreasing reference according to an embodiment.

FIG. 4 is a diagram 400 of voltage versus oscillations depicting a difference between a damped input signal and an undamped input signal using a linearly decreasing reference 402 according to an embodiment. In this example, the damped envelope 304 falls below the linearly decreasing reference 402 at a location 406 corresponding to about 35 counts, while the undamped envelope 308 falls below the linearly decreasing reference 402 at a location 410 corresponding to about 42 counts, increasing the differential between the damped envelope 304 and the undamped envelope 308 to about seven counts.

Adjusting the initial amplitude and altering the slope of the linearly decreasing reference 402 may increase the differential further, providing additional headroom for determining the damped state versus the undamped state of the system. Unfortunately, the equations for the time delta (t) are not easily solved, as can be seen from the following equation:

$$V_i e^{-\alpha_u t} = V\left(1 - \frac{t}{b}\right), \quad (13)$$

where the variable (b) represents the slope of the line. Solving for the attenuation over time can be achieved according to the following equation:

$$-\alpha_u t = \ln\left(1 - \frac{t}{b}\right). \quad (14)$$

In the above example, the linearly decreasing reference 402 should start at a low level and having a small decreasing slope (keeping the reference fairly "flat") to keep the exponential waveform (i.e., the damped envelope 304 and the undamped envelope 308) above the decreasing reference 402 for as long as possible. In an embodiment, the linearly decreasing reference 402 may be configured to have an initial value that is greater than a voltage level of an asymptote of an undamped envelope 308. In an example, the initial value may be approximately one tenth of an initial amplitude of the undamped envelope 308. In addition or in an alternative embodiment, the linearly decreasing reference 402 may include a slope that is less than zero and greater than minus one. In an example, the slope may be approximately −0.1. In another example, the slope may be approximately −0.5. While some additional count differential may be achieved by selecting appropriate values for the linearly decreasing reference 402, an exponentially decreasing reference may provide better differentiation as described below with respect to FIG. 5.

Figure 5:
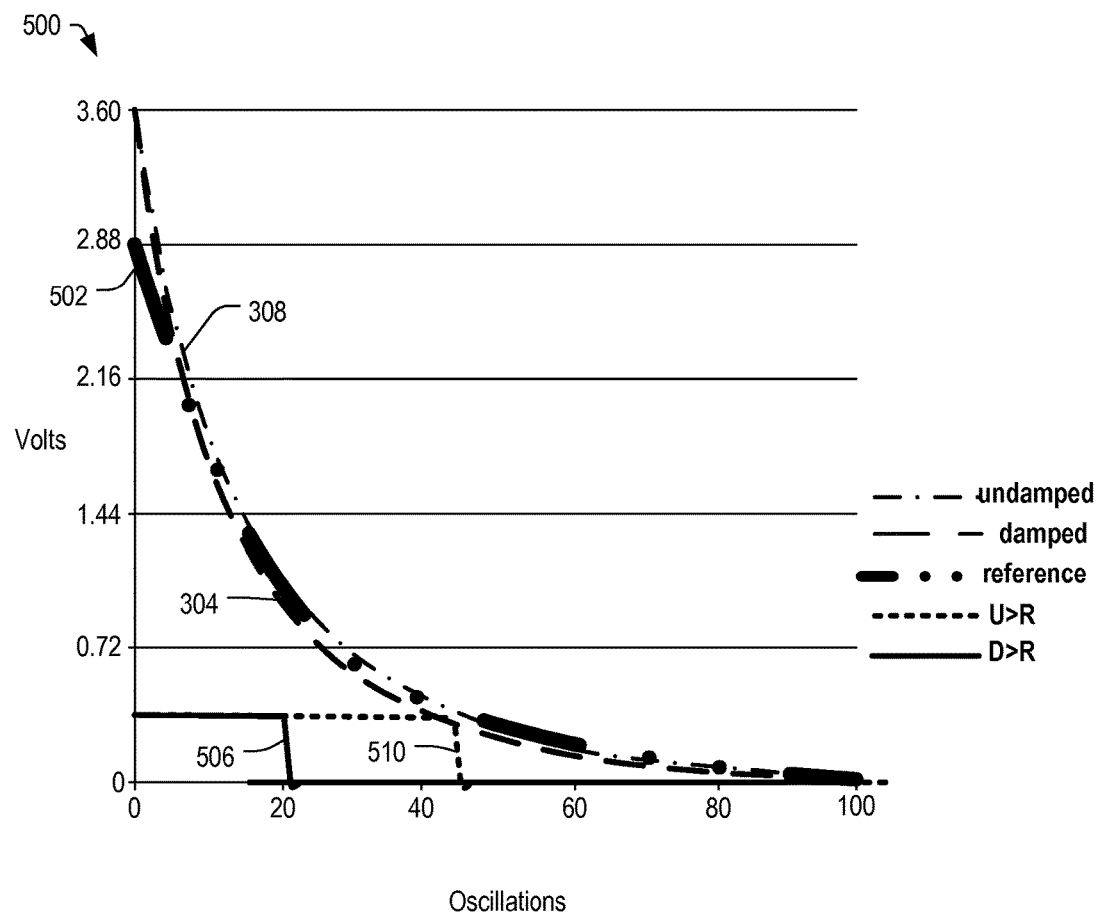
FIG. 5 is a diagram of voltage versus oscillations depicting a difference between a damped input signal and an undamped input signal using an exponentially decreasing reference according to an embodiment.

FIG. 5 is a diagram 500 of voltage versus oscillations depicting a difference between a damped input signal and an undamped input signal using an exponentially decreasing reference 502 according to an embodiment. The exponentially decreasing reference 502 makes it possible to compare an over damped sinusoidal signal to a similar shaped envelope, which provides better differentiation in terms of the counts.

In the illustrated example, the exponentially decreasing reference 502 is selected to start at a slightly lower voltage than the peak voltages of the damped envelope 304 and the undamped envelope 308, which ensures that the oscillation peaks initially exceed the threshold provided by the exponentially decreasing reference 502. Additionally, the attenuating damping factor of the exponentially decreasing reference 502 may be selected to be slightly smaller than the oscillations of the undamped envelope 308, which provides an exponential curve that has a shape suitable to use as a comparison. In particular, by making the initial slope of the exponentially decreasing reference 502 less steep than the undamped envelope 308 ensures that the exponentially decreasing reference 502 will intersect the input signals. These two characteristics of the exponentially decreasing reference 502 ensure intersection with the damped envelope 304 and the undamped envelope 308.

In an embodiment, the shape of the exponentially decreasing reference 502 may be configured to be substantially similar to an average between the damped envelope 304 and the undamped envelope 308. The FSM 108 and/or the MCU 112 may adjust the amplitude and/or damping characteristic to be less than those of the undamped envelope 308, configuring the exponentially decreasing reference 502 to have the same basic shape as the undamped envelope 308 with differences in amplitude and damping. If the reference damping attenuation ($\alpha_{REF}$) is made less than a worst-case, low-temperature undamped inductor damping attenuation, then the measurements may provide an indication of the damping attenuation. The number of counts for the damped and undamped envelopes may vary with temperature, and the criteria of the exponentially decreasing reference 502 may also be varied with temperature. In a digital implementation, the exponentially decreasing reference 502 may be adjusted for temperature using digital criteria. In an analog implementation, the exponentially decreasing reference 502 may be held constant or may be made ratio-metric relative to a battery voltage ($V_{BAT}$).

The derivation of the crossing time and the time delta are shown in the following equations:

$$V_i e^{-\alpha_u t} = V_r e^{-\alpha_r t}. \quad (15)$$

$$\frac{V_i}{V_r} e^{-\alpha_u t} = e^{-\alpha_r t}. \quad (16)$$

$$\ln\left(\frac{V_i}{V_r}\right) - \alpha_u t = -\alpha_r t. \quad (17)$$

$$t = \frac{\ln\left(\frac{V_i}{V_r}\right)}{\alpha_u - \alpha_r}. \quad (18)$$

$$t_u - t_d = \frac{\ln\left(\frac{V_i}{V_r}\right)}{\alpha_u - \alpha_r} - \frac{\ln\left(\frac{V_{ri}}{V_r}\right)}{\alpha_d - \alpha_r}. \quad (19)$$

$$t_u - t_d = \ln\left(\frac{V_i}{V_r}\right)\left(\frac{1}{\alpha_u - \alpha_r} - \frac{1}{\alpha_d - \alpha_r}\right). \quad (20)$$

Though it may not be obvious from equations 15-20 that the delta time is any better or worse than the fixed DC reference implementation described with respect to FIG. 3, experiments demonstrated that the delta can be enhanced by configuring the exponentially decreasing reference 502 to have an initial voltage that is close to the initial voltage of the undamped envelope 308 and making the damping attenuation ratio of the exponentially decreasing reference 502 close to that of the undamped envelope 308. One possible example of such an exponentially decreasing reference is described below with respect to FIG. 6.

Figure 6:
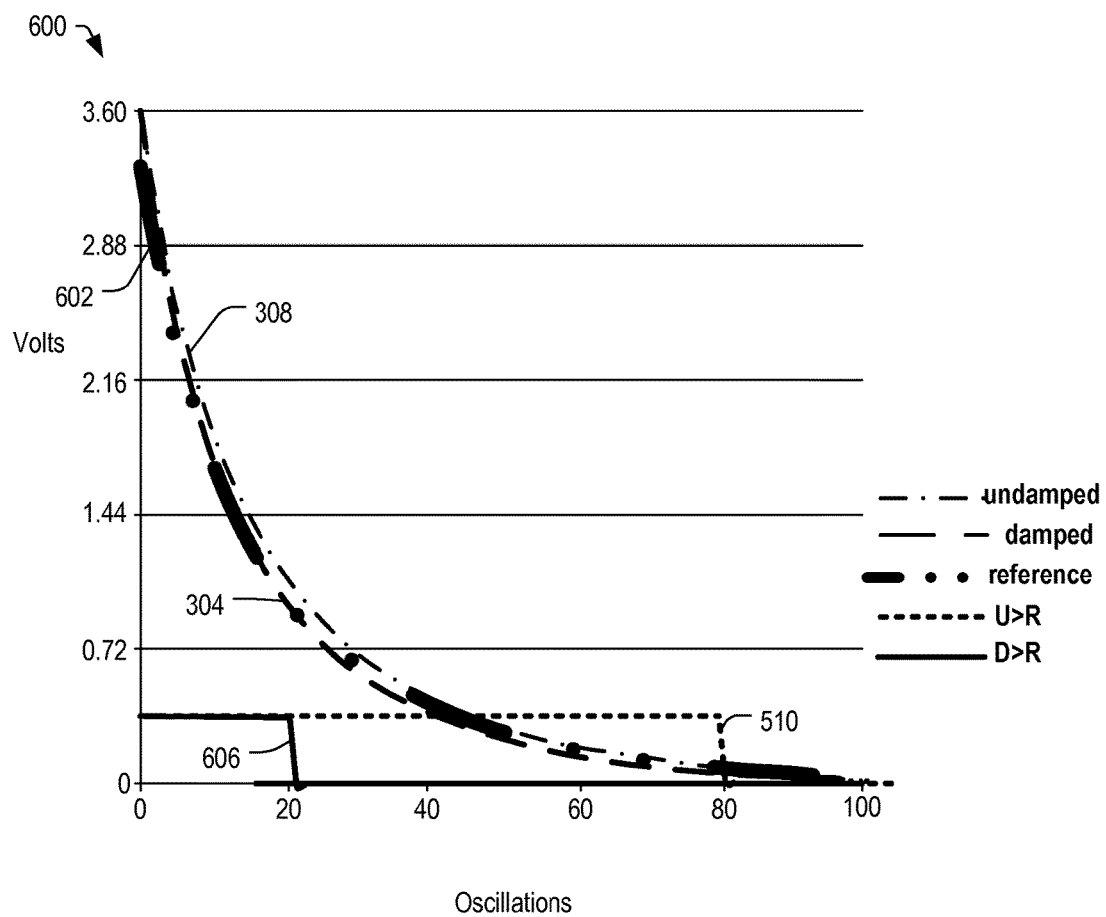
FIG. 6 is a diagram of voltage versus oscillations depicting a difference between a damped input signal and an undamped input signal using an exponentially decreasing reference according to a second embodiment.

FIG. 6 is a diagram 600 of voltage versus oscillations depicting a difference between a damped input signal and an undamped input signal using an exponentially decreasing reference 602 according to a second embodiment. As compared to the exponentially decreasing reference 502 in FIG. 5, the exponentially decreasing reference 602 in FIG. 6 has an initially higher voltage level and has an attenuation that closely matches that of the undamped envelope 308. In this instance, the damped envelope crosses the exponentially decreasing reference 602 at about 21 counts, while the undamped envelope 308 crosses the exponentially decreasing reference 602 at about 80 counts, presenting a large differential to distinguish between the damped and undamped states of the system.

In an embodiment, the FSM 108 and/or the MCU 112 may calculate a suitable shape for the exponentially decreasing reference 602 by determining the damped envelope 304 and the undamped envelope 308 and by calculating an exponential waveform (curve fitting) that closely matches the undamped envelope 308. The FSM 108 and/or the MCU 112 may then control the programmable reference to provide an exponentially decreasing reference 602 to the input of comparator 118 that has a lower initial value than the undamped envelope 308 and that decreases with an attenuation that is slightly slower than that of the undamped envelope 308 such that the exponentially decreasing reference 602 intersects both of the damped envelope 304 and the undamped envelope 308.

In an alternative embodiment, the shape of the exponentially decreasing reference 602 may be controlled using a lookup table and a digital-to-analog converter (DAC), making it possible for the DAC to serve as the programmable reference that may be programmed using pre-determined values from the table to provide the desired reference. In still another embodiment, the controller may cooperate with an external circuit, such as a resistor-capacitor (RC) circuit configured to provide an exponentially decreasing waveform to an input of the circuit. One possible example of a digital circuit implementation is described below with respect to FIG. 7.

Figure 7:
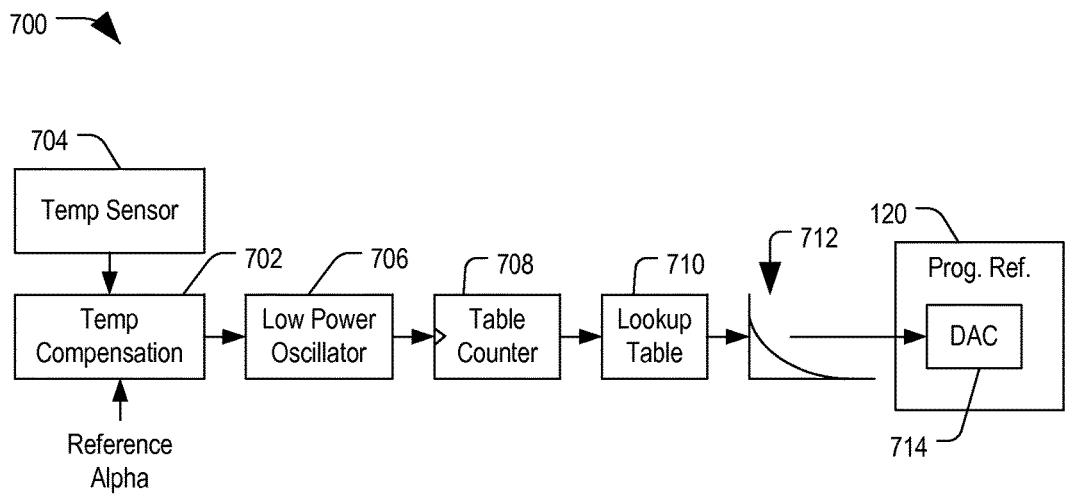
FIG. 7 is a block diagram of a digital implementation of a programmable reference to provide an exponentially decreasing reference according to an embodiment.

FIG. 7 is a block diagram of a digital implementation 700 of a programmable reference to provide an exponentially decreasing reference according to an embodiment. The digital implementation 700 may be used to provide the exponentially decreasing reference to the comparator 118 in FIG. 1 and/or to the comparators 118 and 264 in FIG. 2. The digital implementation includes a temperature compensation circuit 702 configured to receive a reference attenuation value (such as from the FSM 108 and/or the MCU 112) and to receive a temperature value from a temperature sensor 704. The temperature compensation circuit 702 provides a temperature compensated attenuation value (e.g., a frequency value) to a low power oscillator 706, which produces a clock signal in response to the temperature compensated value. The low power oscillator 706 provides a clock signal to a clock input of a table counter 708, which increments values that can be used to retrieve the pre-programmed values from a lookup table 720 to produce an exponentially decreasing signal 712, which is provided to a DAC 724 of the programmable reference 120 to produce the exponentially decreasing reference signal provided to the input of the comparator 118, for example.

In this example, a low power oscillator 706, a table counter 708, a look-up table 720, and a DAC 714 may be used to generate the exponentially decreasing reference waveform. By adjusting the frequency of the low power oscillator 706 using the reference alpha and temperature compensation circuit 702, the step rate is changed at which the lookup table 710 is accessed, such that the frequency changes directly alter the attenuating damping factor of the exponentially decreasing reference. Additionally, digital compensation may alter the count criteria for damped or undamped detection.

In a fully differential implementation with a differential DAC, high and low peak detectors may provide twice the information in a single-ended measurement. One possible example of such a circuit is described below with respect to FIG. 8.

Figure 8:
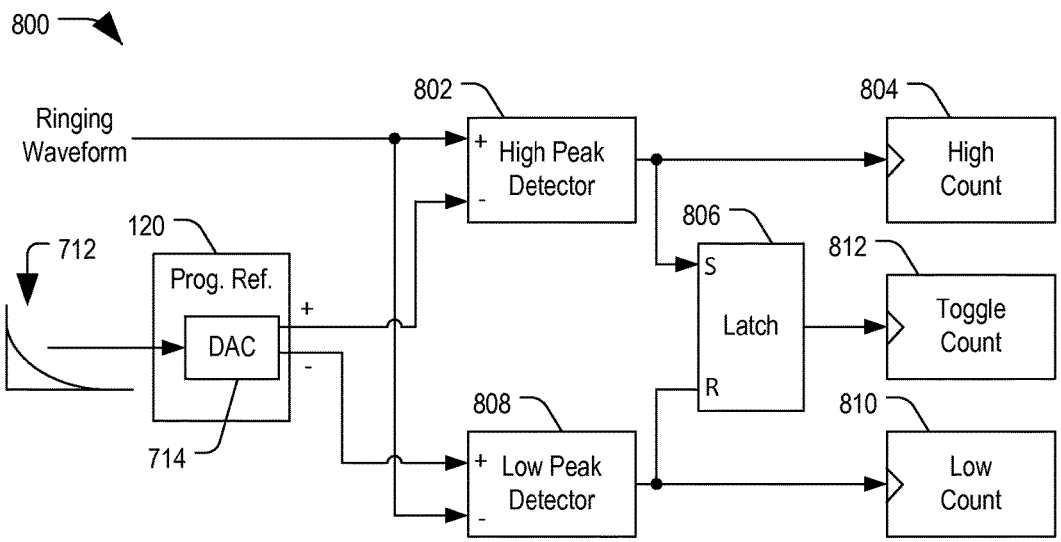
FIG. 8 is a block diagram of a circuit including high and low peak detectors that can use an exponentially decreasing reference according to a second embodiment.

FIG. 8 is a block diagram of a circuit 800 including high and low peak detectors that can use an exponentially decreasing reference according to a second embodiment. Circuit 800 includes a high peak detector 802 including a positive input to receive a ringing waveform, a negative input to receive a positive output of a fully differential implementation of DAC 714, and an output coupled to a clock input of a high count circuit 804. The output is also coupled to a set input of a set-reset (S-R) latch 806.

Circuit 800 further includes a low peak detector 808 including a positive input coupled to a negative output of the fully differential DAC 714, a negative input to receive the ringing waveform, and an output coupled to a clock input of a low count circuit 810. The output of the low peak detector 808 is also coupled to a reset input of the S-R latch 806. The S-R latch 806 further includes an output coupled to a clock input of a toggle count circuit 812.

In the illustrated embodiment of FIG. 8, the differential DAC 714 and high peak detector 802 and low peak detector 808 provide twice the information of a single-ended measurement. The circuit 800 counts peaks of the ringing waveform when the high peak circuit 802 detects that the ringing waveform exceeds the exponentially decreasing reference. Further, the circuit 800 counts peaks of the ringing waveform when the low peak circuit 808 detects that peaks of the inverse of the ringing waveform exceed the exponentially decreasing reference. The S-R latch 806 may provide a toggle count to a toggle count circuit 812 that may be less susceptible to noise, which might otherwise cause multiple positive or negative peaks to be detected.

While the above discussion has described embodiments of the programmable reference and associated control circuitry that may be implemented digitally, it may also be possible to provide the exponentially decreasing reference using an analog implementation. One possible analog implementation is described below with respect to FIG. 9.

Figure 9:
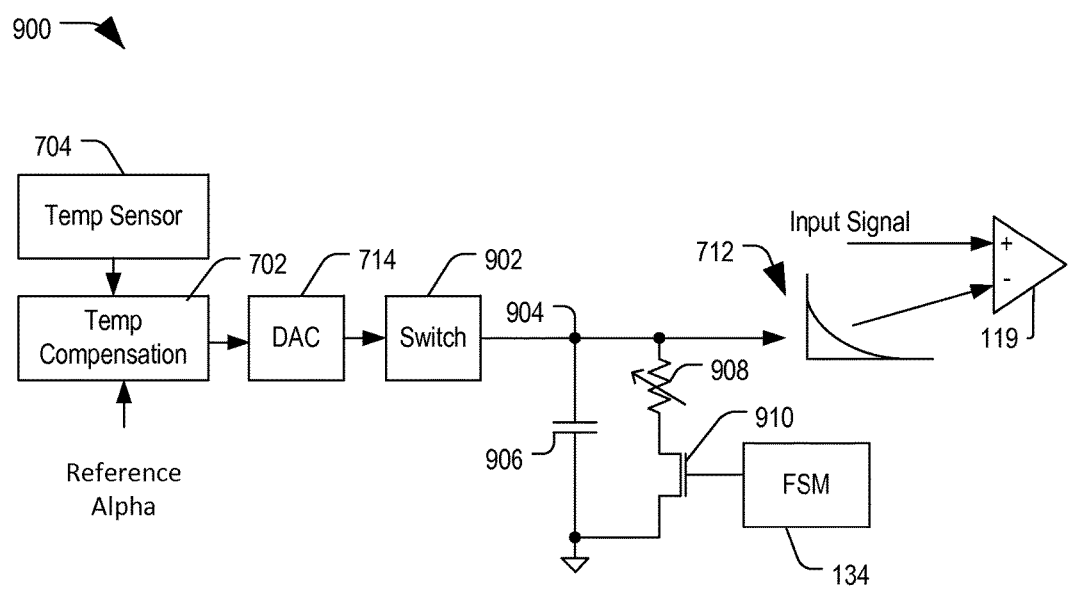
FIG. 9 is a diagram of an analog implementation of a programmable reference to provide an exponentially decreasing reference according to an embodiment.

FIG. 9 is a diagram of an analog implementation 900 of a programmable reference to provide an exponentially decreasing reference according to an embodiment. The analog implementation 900 may be used to provide the exponentially decreasing reference to the comparator 118 in FIG. 1 and/or to the comparators 118 and 264 in FIG. 2 (or high peak detector 802 and low peak detector 808 in FIG. 8). The analog implementation includes the temperature compensation circuit 702, the temperature sensor and the DAC 714 of FIG. 7; however, the DAC 714 may be separate from the programmable reference 120. In this implementation, a switch 902 is coupled between the DAC 714 and a node 904. A capacitor 906 may be coupled between the node 904 and a power supply. A variable resistor 908 may be coupled between the node 904 and a transistor 910, which is coupled between the variable resistor 908 and the power supply. The node 904 may be coupled to the comparator to provide the exponentially decreasing reference 712 to the input of the comparator 118. A gate of the transistor 910 may be coupled to FSM 134 or to another controller, which may be internal to the metering circuit 102 or 202 or which may be external to the circuit.

In an embodiment, the DAC 714 charges the capacitor 906 to an initial voltage. The variable resistor 908 and the transistor 910 are used to discharge the capacitor 906, producing the exponentially decreasing reference 712. In an embodiment, the capacitor 906 may be external to the metering circuit 102 or 202, saving chip area by eliminating a large capacitor and allowing a smaller, low-resistance resistor 908. An external implementation of the capacitor 906 may also provide a wider range to suit a wider range of inductors, and the associated external pin may be a dual-use pin that can be used during set-up and debugging processes.

In another embodiment, the variable resistor 908 may also be external to the metering circuit 102 or 202. The variable resistor 908 may provide a lower temperature constant, such as 100 ppm per degree Celsius for a 1% resistor. Further, the variable resistor may be used for calibration. An example of one possible calibration process is described below with respect to FIG. 10.

Figure 10:
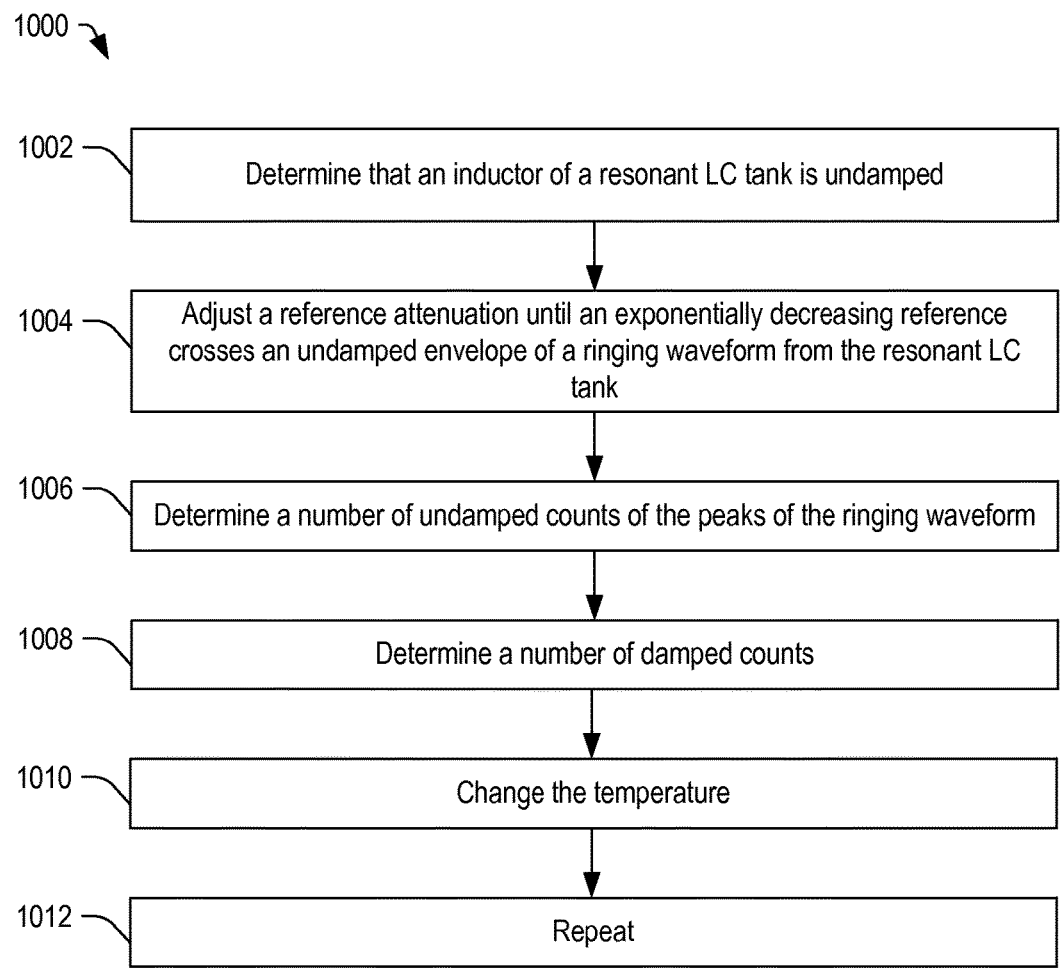
FIG. 10 is a flow diagram of a method of calibrating a programmable reference according to an embodiment.

FIG. 10 is a flow diagram of a method 1000 of calibrating a programmable reference according to an embodiment. At 1002, the state of the system is analyzed to determine that the inductor of an LC resonant tank is undamped. Advancing to 1004, a reference attenuation is adjusted until an exponentially decreasing reference crosses an undamped envelope of a ringing waveform from the resonant LC tank. Continuing to 1006, a number of undamped counts of the peaks of the ringing waveform are determined. Advancing to 1008, a number of undamped counts of the peaks of the ringing waveform are determined.

Proceeding to 1010, the temperature is changed. Continuing to 1012, blocks 1002 through 1008 are repeated for cold temperatures (adjusting the reference attenuation if necessary) and repeated again for hot temperatures (adjusting the reference attenuation if necessary). In this process, if the reference attenuation is set too high, then the undamped envelope will not cross the exponentially decreasing reference. In this case, the number of counts may be determined by the hysteresis of the analog comparators.

Figure 11:
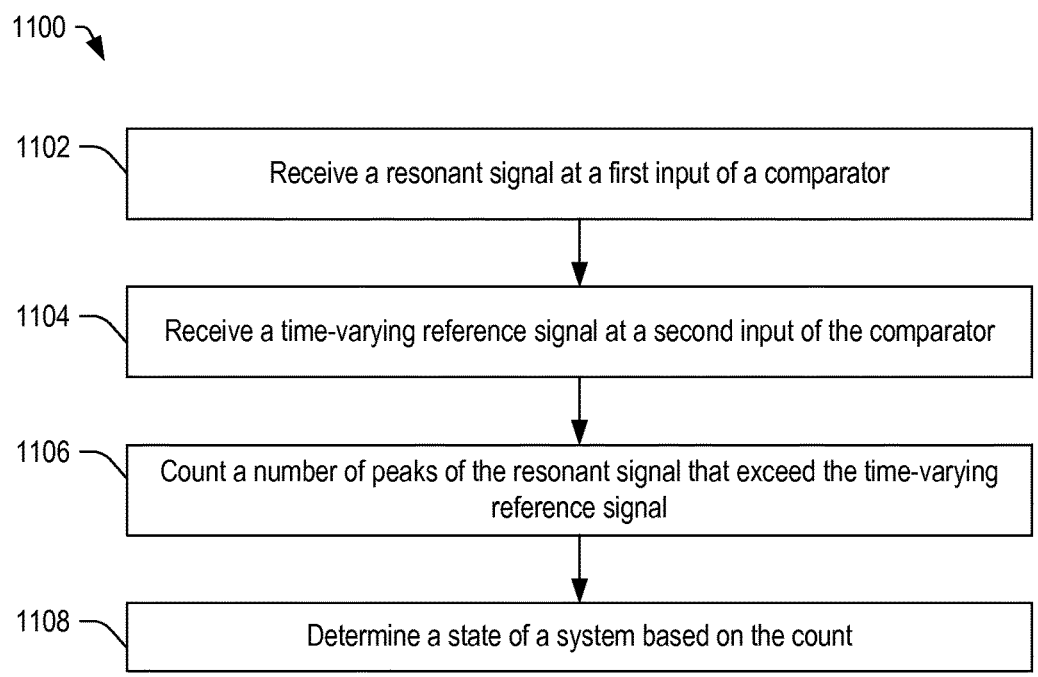
FIG. 11 is a flow diagram of a method of providing a time-varying reference according to an embodiment.

FIG. 11 is a flow diagram of a method 1100 of providing a time-varying reference according to an embodiment. At 1102, a resonant signal is received at a first input of a comparator. The resonant signal may be received from a resonant LC tank, a bridge circuit, or another signal source. Continuing to 1104, a time-varying reference signal is received at a second input of the comparator. In response to the resonant signal and the time-varying reference signal, the comparator may produce a logic high signal when the resonant signal exceeds the time-varying reference signal and a logic low signal when the resonant signal falls below the time-varying reference signal. The logic high and logic low signals may be presented as pulses to a counter circuit.

Advancing to 1106, a number of peaks of the resonant signal that exceed the time-varying reference signal are counted. Advancing to 1108, the circuit may determine the state of the system based on the count. In an example, the circuit may determine whether the resonant source is in a damped state or an undamped state based on the count.

The slope or attenuation, the initial value, and other characteristics of the time-varying reference signal may be determined based on the undamped envelope of the input signal. In an embodiment, linearly decreasing reference is selected to have an initially low voltage level and to have a slope that is close to zero to extend the time between when the damped envelope crosses the reference as compared to when the undamped envelope crosses the reference. In another embodiment, the exponentially decreasing reference is selected to have an initial voltage level that is close to that of the undamped envelope and to have an attenuation that is slightly less than that of the undamped envelope to ensure that the damped and undamped envelopes are initially higher than the reference and that they will eventually cross the reference.

An exponentially decreasing threshold applied as a reference signal may be used to differentiate between small changes in an attenuation of a signal. By setting the reference so that the undamped response crosses the exponentially decreasing reference at cold temperatures, the circuit may be used to make accurate measurements over a wide temperature range. Further, temperature compensation may be provided in either analog or digital implementations.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive. Workers skilled in the art will recognize that changes will recognize that changes may be made in form and detail without departing from the scope of the invention.

What is claimed is:

1. A metering circuit comprising:
   a comparator including a first input to receive an input signal having a ringing waveform from a resonant circuit, and including a second input and a comparator output, the comparator configured to detect peaks in the input signal; and
   a reference source including a reference output coupled to the second input of the comparator to provide a time-varying reference signal that has an amplitude that decreases over time during a peak counting operation, the time-varying reference signal configured to enable the comparator to discriminate between damped and undamped ringing waveforms.

2. The metering circuit of claim 1, wherein the reference source provides a linearly decreasing reference signal as the time-varying reference signal.

3. The metering circuit of claim 2, wherein the linearly decreasing reference signal includes an initial value that is greater than a voltage level of an asymptote of an undamped envelope of the input signal.

4. The metering circuit of claim 2, wherein the linearly decreasing reference signal includes a slope that is less than zero and greater than minus one.

5. The metering circuit of claim 1, wherein the reference source provides an exponentially decreasing reference signal as the time-varying reference signal.

6. The metering circuit of claim 5, wherein the exponentially decreasing reference signal includes an initial value that is less than a peak amplitude of an undamped envelope of the input signal.

7. The metering circuit of claim 5, wherein the exponentially decreasing reference signal includes an attenuation that is less than an attenuation of an undamped envelope of the input signal.

8. The metering circuit of claim 5, wherein the exponentially decreasing reference signal is programmable.

9. The metering circuit of claim 1, wherein the reference source comprises a digital-to-analog converter.

10. The metering circuit of claim 1, wherein the reference source comprises a variable resistor and a capacitor coupled in parallel between the first input and a power supply.

11. A metering circuit comprising:
a first comparator including a first input, a second input, and an output, the first input configured to receive a resonant signal from a resonant circuit, the second input to receive, from a programmable reference circuit, a time-varying reference signal that decreases over time to discriminate between damped and undamped resonant signals;
a counter to count pulses at the output of the first comparator; and
a second comparator to determine a state of a system based on a count at an output of the counter.

12. The metering circuit of claim 11, further comprising the programmable reference circuit including a digital-to-analog converter to provide the time-varying reference signal to the second input of the comparator.

13. The metering circuit of claim 12, further comprising a finite state machine to control the digital-to-analog converter to provide the time-varying reference signal.

14. The metering circuit of claim 11, wherein the second comparator includes a first input coupled to the output of the counter, a second input to receive a discriminator threshold, and an output to provide a signal indicating the state of the system based on the count.

15. The metering circuit of claim 11, wherein the time-varying reference signal comprises a linearly decreasing reference signal.

16. The metering circuit of claim 11, wherein the time-varying reference signal comprises an exponentially decreasing reference signal.

17. The metering circuit of claim 11, further comprising:
a temperature compensation circuit to receive a reference attenuation signal and a temperature signal and to provide an output signal indicating a frequency;
a low power oscillator to receive the frequency and to provide a clock signal proportional to the frequency;
a table counter to output data in response to the clock signal;
a table look up to provide values to the input of the digital-to-analog converter to produce the time-varying reference signal.

18. The metering circuit of claim 11, further comprising:
a capacitor coupled between the second input of the comparator and a power supply;
a variable resistor coupled between the second input of the comparator and a node; and
a transistor coupled between the node and the power supply, the transistor including a gate responsive to a control signal to couple the variable resistor to the power supply to produce the time-varying reference signal by discharging the capacitor.

19. A method of providing a time-varying signal comprises:
receiving a resonant signal from a resonant circuit at a first input of a comparator;
receiving a time-varying reference signal from a programmable reference circuit at a second input of a comparator, the time-varying reference signal decreasing over time to discriminate between damped and undamped resonant signals;
counting a number of peaks of the resonant signal that exceed the time-varying reference signal using a counter coupled to an output of the comparator; and
determining a state of a system based on the count.

20. The method of claim 19, wherein the time-varying reference signal comprises an exponentially decreasing reference signal.

* * * * *